United States Patent
Fourmont

(10) Patent No.: US 11,175,317 B2
(45) Date of Patent: Nov. 16, 2021

(54) SYSTEM FOR DETECTING A DROP IN VOLTAGE OF AN AC POWER SUPPLY

(71) Applicant: SAFRAN ELECTRONICS & DEFENSE, Paris (FR)

(72) Inventor: Tony Fourmont, Paris (FR)

(73) Assignee: SAFRAN ELECTRONICS & DEFENSE, Paris (FR)

(*) Notice: Subject to any disclaimer, the term of this patent is extended or adjusted under 35 U.S.C. 154(b) by 0 days.

(21) Appl. No.: 17/267,336

(22) PCT Filed: Aug. 20, 2019

(86) PCT No.: PCT/EP2019/072225
§ 371 (c)(1),
(2) Date: Feb. 9, 2021

(87) PCT Pub. No.: WO2020/038918
PCT Pub. Date: Feb. 27, 2020

(65) Prior Publication Data
US 2021/0231714 A1    Jul. 29, 2021

(30) Foreign Application Priority Data
Aug. 24, 2018   (FR) ...................................... 1870949

(51) Int. Cl.
*H02H 3/247*   (2006.01)
*G01R 19/165*  (2006.01)
(Continued)

(52) U.S. Cl.
CPC ....... *G01R 19/16547* (2013.01); *H02H 3/247* (2013.01); *H02J 9/062* (2013.01); *H02M 1/0096* (2021.05); *H02M 1/322* (2021.05)

(58) Field of Classification Search
CPC .............. H02H 3/247; G01R 19/16576; G01R 19/16547; H02M 1/0096; H02M 1/322; H02J 9/062
See application file for complete search history.

(56) References Cited

U.S. PATENT DOCUMENTS 3,852,731 A * 12/1974 Hollands .......... G01R 19/16547
340/663
4,864,163 A *  9/1989 Nakao ................ G01R 19/1658
327/84
(Continued)

FOREIGN PATENT DOCUMENTS

JP        57192875 A  * 11/1982  ......... G01R 19/1658

OTHER PUBLICATIONS

Sep. 11, 2019 International Search Report issued in International Patent Application No. PCT/EP2019/072225.

*Primary Examiner* — Harry R Behm
(74) *Attorney, Agent, or Firm* — Oliff PLC

(57) ABSTRACT

A device for detecting a drop in voltage of an AC supply delivering electrical energy to an energy converter in order to supply electrical equipment, the device being connected to an electrical energy reserve for supplying the energy converter. The device includes a full-wave rectifier for rectifying the AC supply, a comparator that compares a first predetermined voltage with a full-wave rectified voltage, a circuit for charging a capacitor in order to charge the capacitor when the rectified voltage is below the predetermined threshold, a circuit for discharging the capacitor in order to discharge the capacitor when the rectified voltage is above the predetermined threshold, a comparator for comparing the voltage at the terminals of the capacitor with a second predetermined voltage, and a circuit for controlling the reserve of electrical energy.

4 Claims, 6 Drawing Sheets

(51) Int. Cl.
*H02J 9/06* (2006.01)
*H02M 1/00* (2006.01)
*H02M 1/32* (2007.01)

(56) References Cited

U.S. PATENT DOCUMENTS

2005/0088793 A1    4/2005  Anderson et al.
2012/0318914 A1*  12/2012  Rajashekara .......... B64D 41/00
                                                            244/58
2016/0065001 A1    3/2016  Yasukawa et al.
2016/0164428 A1*   6/2016  Chen .................. G01R 19/0007
                                                            307/130
2017/0287655 A1  10/2017  Lin et al.

* cited by examiner

SYSTEM FOR DETECTING A DROP IN VOLTAGE OF AN AC POWER SUPPLY

TECHNICAL FIELD

The present invention relates to a system for detecting a drop in voltage of an AC power supply delivering electrical energy to an energy converter in order to supply electrical equipment.

PRIOR ART

Electrical equipment, such as for example equipment installed in an aircraft, is supplied by an energy converter that receives electrical energy by means of an electrical supply bus. The energy converter modifies the value of the AC supply voltage or rectifies the electrical supply voltage and modifies the value of the voltage in order to provide an electrical energy supply adapted to the electrical equipment.

When the energy supply is interrupted or the amplitude thereof is below an operating threshold of the energy converter, the electrical energy converter can no longer provide an electrical energy supply adapted to the electrical equipment.

Energy reserves are associated with an energy converter in order to overcome this deficiency of the energy supply and are controlled by a device for detecting a drop in voltage of the electrical energy supply.

These energy reserves are dependent on the equipment to be supplied and the time during which the latter must remain live.

When the electrical energy supply is a DC supply, it is easy to detect a total loss of the electrical supply or a drop in the amplitude thereof. A simple comparison thereof with a threshold is sufficient and makes it possible to quickly demand an energy reserve. When the electrical energy supply is an AC supply, a simple comparison of voltage delivered by a peak detector with a threshold does not make it possible to obtain a detection within a time less than a half period of the electrical supply.

DISCLOSURE OF THE INVENTION

The aim of the present invention is to solve the drawbacks of the prior art by proposing a device for detecting a drop in voltage of the electrical energy supply that makes it possible to detect, within a time less than a half-alternation of the electrical supply, a total loss of the AC electrical supply or a drop in the value of the voltage of the AC electrical energy supply.

For this purpose, according to a first aspect, the invention proposes a device for detecting a drop in voltage of an AC supply delivering electrical energy to an energy converter in order to supply electrical equipment, the device being connected to an electrical energy reserve for supplying the energy converter, characterised in that the device comprises:

a full-wave rectifier for rectifying the AC supply, a comparator that compares a first predetermined voltage with a full-wave rectified voltage obtained from a full-wave rectifier that rectifies the AC supply, a circuit for charging a capacitor in order to charge the capacitor when the rectified voltage is below the predetermined threshold, a circuit for discharging the capacitor in order to discharge the capacitor when the rectified voltage is above the predetermined threshold, a comparator for comparing the voltage at the terminals of the capacitor with a second predetermined voltage, a circuit for controlling the reserve of electrical energy in order to activate the electrical energy reserve for supplying electrical energy to the energy converter only when the voltage at the terminals of the capacitor is above the second predetermined voltage.

Thus it is possible to detect, within a time less than a half-alternation of the electrical supply, a total loss of the AC electrical supply or a drop in the value of the voltage of the AC electrical energy supply.

In addition, the device for detecting a drop in voltage of an AC supply comprises few electronic components and is thus compact, which facilitates use thereof in an aircraft.

The circuit for charging a capacitor in order to charge the capacitor when the rectified voltage is below the predetermined threshold constitutes a time delay, the length of which is determined according to the characteristics of the AC supply and of the energy converter.

According to a particular embodiment of the invention, the device comprises means for offsetting the voltage of the full-wave rectified voltage when the voltage at the terminals of the capacitor is higher than the second predetermined voltage.

Detecting a voltage drop or a total loss of the electrical energy supply is thus possible within a time less than a half-alternation of the electrical supply while avoiding any false detection.

According to a particular embodiment of the invention, the device comprises means for offsetting the voltage of the second predetermined voltage when the first predetermined voltage is higher than the full-wave rectified voltage.

Thus the detection is clear and stable and is robust to unwanted detections related to any stray voltages that might be added to the measured voltage.

According to a particular embodiment of the invention, the device comprises means for offsetting the voltage of the full-wave rectified voltage when the voltage at the terminals of the capacitor is higher than the second predetermined voltage.

Thus the detection is insensitive to an increase in the level of the electrical supply voltage when there are variations in the electrical-energy consumption, an increase for example related to a reduction in line voltage losses.

According to a particular embodiment of the invention, the device comprises means for notifying the electrical equipment when the electrical energy reserve is controlled so as to be activated for the supply of electrical energy to the energy converter solely when the voltage at the terminals of the capacitor is higher than the second predetermined voltage.

Thus the electrical equipment can perform operations such as for example storage of data or the stoppage of a computer program before the electrical energy reserve is exhausted.

The invention also relates to an aircraft, characterised in that it comprises the device for detecting a drop in voltage of an AC supply delivering electrical energy to the energy converter according to the present invention.

BRIEF DESCRIPTION OF THE DRAWINGS

The features of the invention mentioned above, as well as others, will emerge more clearly from reading the following description of an example embodiment, said description being made in relation to the accompanying drawings, among which.

DETAILED DISCLOSURE OF EMBODIMENTS

Figure 1:
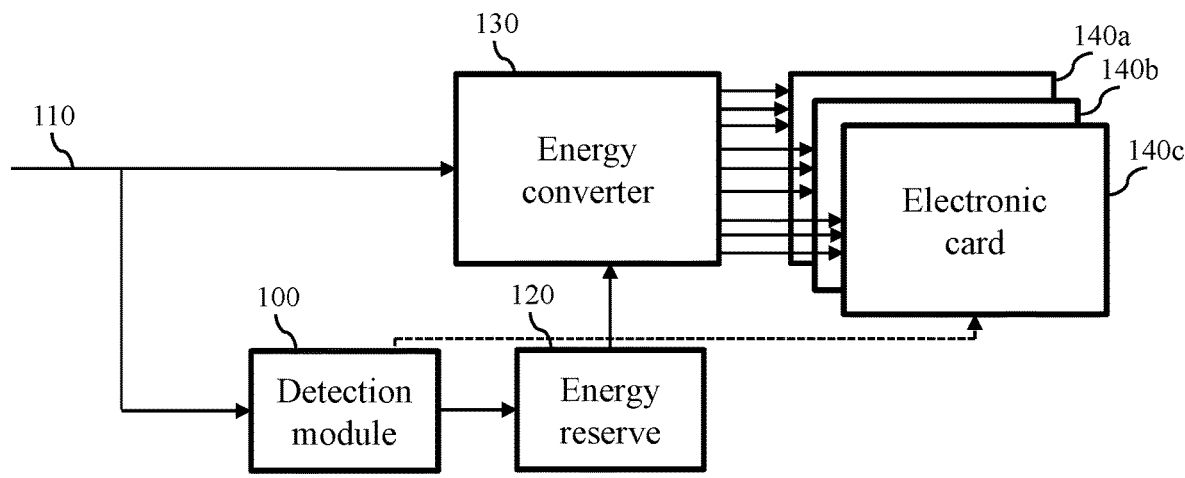
FIG. 1 shows a system for detecting a drop in voltage of an AC supply delivering electrical energy to an energy converter in order to supply electrical equipment wherein the present invention is implemented.

FIG. 1 shows a system for detecting a drop in voltage of an AC supply delivering electrical energy to an energy converter in order to supply electrical equipment wherein the present invention is implemented.

The system for detecting a drop in voltage of an AC supply delivering electrical energy supplied by a bus 110 comprises an energy converter 130 that supplies one or a plurality of items of electrical equipment such as electronic cards 140a, 140b and 140c.

An item of electrical equipment may for example be an electric motor.

The system for detecting a drop in voltage of an AC supply comprises an electrical energy reserve 120 that is activated by a detection module 100 according to the present invention.

When the electrical equipment is electronic cards, the detection module 100 according to the present invention may be connected to the electronic cards 140a to 140c so as to inform the latter of the loss of AC electrical energy, in order for example to back up current processing operations.

The system is, in a particular embodiment of the present invention, installed in an aircraft.

Figure 2:
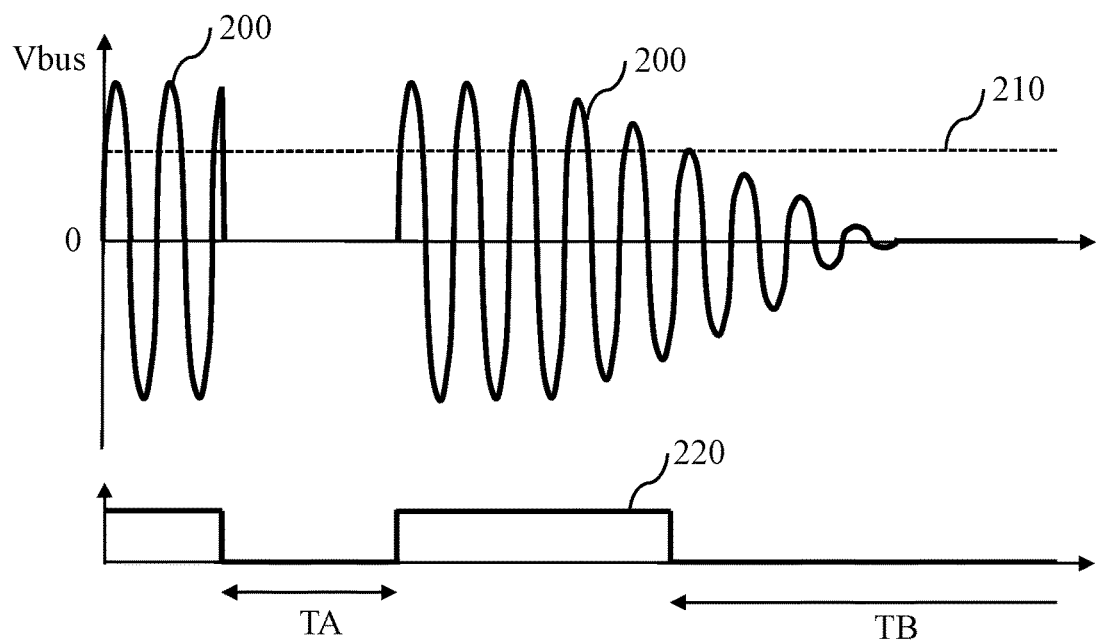
FIG. 2 shows an example of the change in an AC supply and the detection of a drop in voltage of an AC supply delivering electrical energy to an energy converter in order to supply electrical equipment.

FIG. 2 shows an example of the change in an AC supply and the detection of a drop in voltage of an AC supply delivering electrical energy to an energy converter in order to supply electrical equipment.

The voltage of the electrical energy supply of the bus 110 is denoted 200.

The signal output from the detection module 100 is denoted 220 in FIG. 2.

When the electrical energy supply of the bus 110 is disrupted, the detection module 100 detects this during the period TA.

When the voltage of the electrical energy supply of the bus 110 becomes below an operating threshold of the energy converter 130, the detection module 100 detects this during the period TB.

Figure 3:
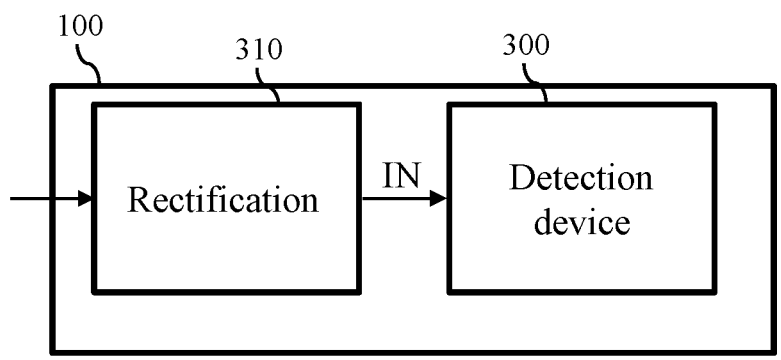
FIG. 3 is a block diagram of a module for detecting a drop in voltage of the electrical energy supply according to the present invention.

FIG. 3 is a block diagram of a module for detecting a drop in voltage of the electrical energy supply according to the present invention.

The module for detecting a drop in voltage of the electrical energy supply 100 comprises a full-wave rectifying device 310 that supplies a rectified signal IN to the device for detecting a drop in voltage of the electrical energy supply 300.

Figure 4:
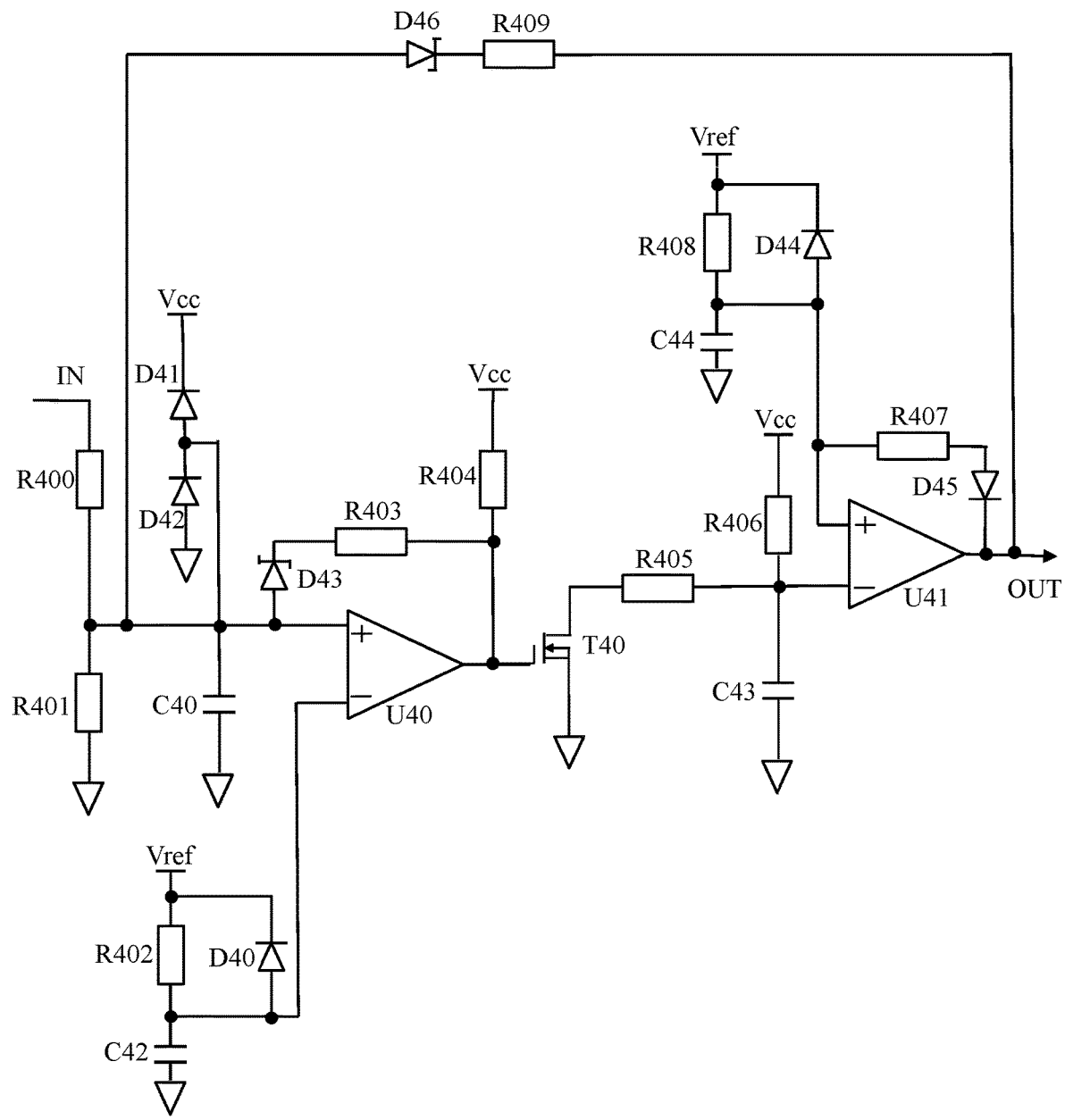
FIG. 4 is an example of an electrical diagram of a device for detecting a drop in voltage of the electrical energy supply according to the present invention.

FIG. 4 is an example of an electrical diagram of a device for detecting a drop in voltage of the electrical energy supply according to the present invention.

The input IN of the device for detecting a drop in voltage of the electrical energy supply is connected to a first termination of a resistor R400. A second termination of the resistor R400 is connected to a first termination of a resistor R401, the anode of a Zener diode D43, to a first termination of a capacitor C40 and to a positive input of a comparator U40.

A second termination of the resistor R401 is connected to the earth of a DC supply Vcc.

A second termination of the capacitor C40 is connected to earth.

The resistors R400 and R401 form a voltage divider bridge for the rectified AC voltage present at the input IN.

A cathode of a diode D42 is connected to an anode of a diode D41 and to the positive input of the comparator U40.

The anode of the diode D42 is connected to earth and the cathode of the diode D41 is connected to the supply Vcc. The function of the diodes D41 and D42 is to protect the input of the comparator U40.

When the input of the comparator U40 does not need to be protected, the diodes D41 and D42 can be omitted.

A first termination of a resistor R402 is connected to a voltage reference Vref, the value of which is for example 2.048 V, and to a cathode of a diode D40.

A second termination of the resistor R402 is connected to a first termination of a capacitor C42, to the anode of the diode D40 and to a negative input of the comparator U40.

A second termination of the capacitor C42 is connected to earth.

This device makes it possible to avoid unwanted triggerings when the system is powered up when the internal supply voltages of the detection device are not yet stabilised.

The voltage reference Vref, the resistor R402, the capacitor C42 and the diode D40 give a constant voltage on the negative input of the comparator U40.

The output of the comparator U40 is connected to the gate of a transistor T40, to a first termination of a resistor R403 and to a first termination of a resistor R404.

A second termination of the resistor R403 is connected to the cathode of the Zener diode D43 and a second termination of the resistor R404 is connected to the supply Vcc that supplies the comparator U40.

When the voltage on the positive input at the input of the comparator U40 is higher than the voltage on the negative input of the comparator U40, the output of the comparator U40 is at the high level and saturates the transistor T40.

When the voltage on the positive input at the input of the comparator U40 is lower than the voltage on the negative input of the comparator U40, the output of the comparator U40 is at the low level, and switches the transistor T40 off.

A hysteresis voltage then appears on the positive input of the comparator U40.

The resistors R403 and R404 and the diode D43 form the hysteresis voltage.

The source of the transistor T40 is connected to earth and the drain of the transistor T40 is connected to a first termination of a resistor R405.

A second termination of the resistor R405 is connected to a first termination of a capacitor C43, to a first termination of a resistor R406 and to a negative input of a comparator U41.

A second termination of the resistor R406 is connected to the supply Vcc that supplies the comparator UR41.

A second termination of the capacitor C43 is connected to earth.

A first termination of a resistor R408 is connected to the voltage reference Vref and to a cathode of a diode D44.

The voltage reference is for example 2.048 V, and could be any other in another application, subject to an adaptation of the time constant issuing from R405 and C43.

A second termination of the resistor R408 is connected to a first termination of a capacitor C43, to the anode of the diode D44, to a first termination of a resistor R407 and to a negative input of the comparator U40.

A second termination of the capacitor C44 is connected to earth.

The voltage reference Vref, the resistor R408, the capacitor C44 and the diode D44 give a constant voltage on the positive input of the comparator U41.

A second termination of the resistor R407 is connected to the anode of a diode D45, the cathode of which is connected to the output of the comparator U41.

When the transistor T41 is conducting, the capacitor C43 is discharged by means of the low-value resistor R405.

When the transistor T40 is off, the capacitor C41 charges up by means of the resistor R406.

When the voltage at the terminals of the capacitor C43 is lower than the voltage on the positive input of the comparator U41, the output of the comparator U41 is at the high state.

When the voltage at the terminals of the capacitor C43 is higher than the voltage on the positive input of the comparator U41, the output of the comparator U41 is at the low state, the diode D43 is conducting and a hysteresis appears on the positive input of the comparator U41.

This very-high-value hysteresis makes it possible to lock the switching of the output of the comparator U41, the triggering of which was caused by the time delay defined by R406 and C43 being exceeded.

The output of the comparator U41 is connected to the output OUT of the device for detecting a drop in voltage of the electrical energy supply and to a first termination of a resistor R409. A second termination of the resistor R409 is connected to a cathode of a diode D46.

The anode of the diode D46 is connected to the positive input of the comparator U40.

The resistor R409 and the diode D46 form a hysteresis when the output of the comparator U41 is at the low state.

The hysteresis thus produced makes it possible to lock the whole of the chain for detecting a drop in electrical energy supply voltage as soon as the event occurs.

The unlocking occurs when the input voltage IN returns to the normal operating range, that is to say by applying a voltage on the positive input of the comparator U40 beyond the hysteresis created by R409 and D46.

Figure 5:
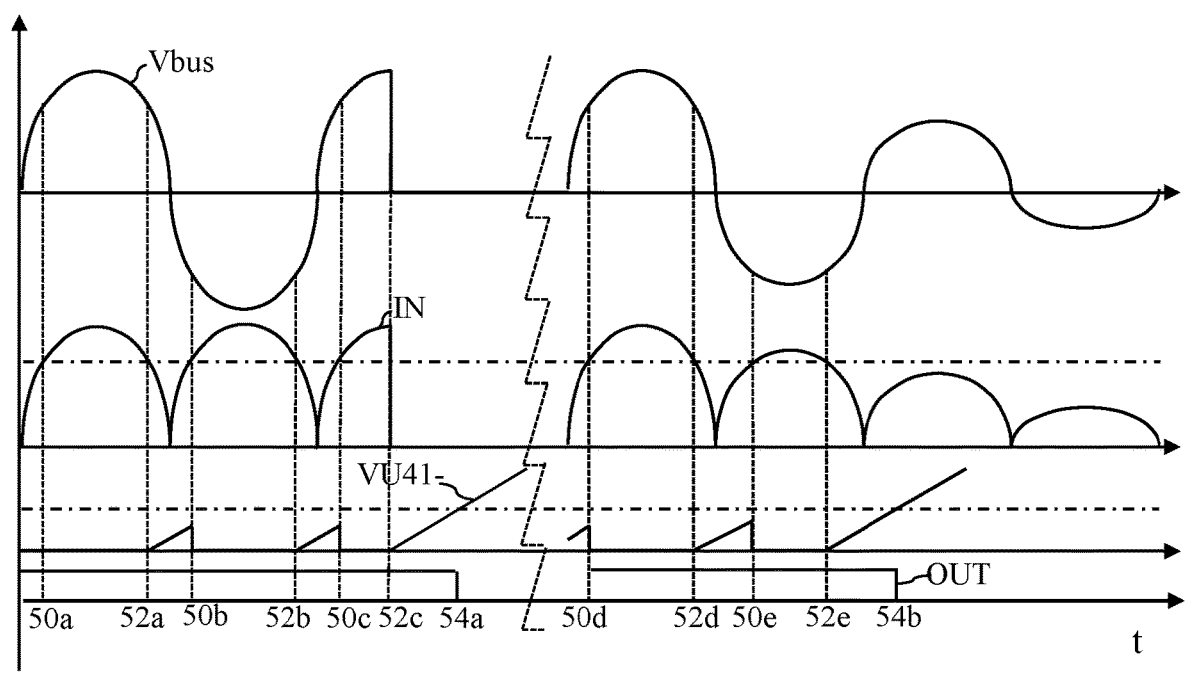
FIG. 5 shows the change in various signals in the module for detecting a drop in voltage of the electrical energy supply according to the present invention.

FIG. 5 shows the change in various signals in the module for detecting a drop in voltage of the electrical energy supply according to the present invention.

FIG. 5 shows the voltage Vbus, the voltage IN at the input of the device for detecting a drop in voltage of the electrical energy supply, the voltage OUT at the output of the device for detecting a drop in voltage of the electrical energy supply and the voltage VU41- present on the negative input of the comparator U41.

At the instant 50a, the voltage IN is higher than the minimum operating value of the energy converter 130, the transistor T40 of FIG. 4 is saturated and the capacitor C43 is discharged. The output OUT is at the high state and the energy reserve is not activated.

At the instant 52a, the voltage IN is lower than the minimum operating value of the energy converter 130, the transistor T40 of FIG. 4 is off and the capacitor C41 charges until the instant 50b and the value of the negative input of the comparator U41 is lower than the voltage on the positive input of the comparator UR1, the output OUT remains at the high state and the energy reserve is not activated.

At the instant 50b, the voltage IN is higher than the minimum operating value of the energy converter 130, the transistor T40 of FIG. 4 is saturated and the capacitor C43 discharges, the value at the negative input of the comparator U41 is lower than the voltage on the positive input of the comparator UR1, the output OUT remains at the high state and the energy reserve is not activated.

At the instant 52b, the voltage IN is lower than the minimum operating value of the energy converter 130, the transistor T40 of FIG. 4 is off and the capacitor C43 charges until the instant 50c and the value at the negative input of the comparator U41 is lower than the voltage on the positive input of the comparator UR1, the output OUT remains at the high state and the energy reserve is not activated.

At the instant 50c, the voltage IN is higher than the minimum operating value of the energy converter 130, the transistor T40 of FIG. 4 is saturated and the capacitor C43 discharges, the value at the negative input of the comparator U41 is lower than the voltage on the positive input of the comparator UR1, the output OUT remains at the high state and the energy reserve is not activated.

At the instant 52c, the voltage IN is lower than the minimum operating value of the energy converter 130, the transistor T40 of FIG. 4 is off and the capacitor C43 charges until the instant 54a and the value at the negative input of the comparator U41 is higher than the voltage on the positive input of the comparator UR1, the output OUT passes to the low state and the energy reserve is activated.

At the instant 50d, the voltage IN is higher than the minimum operating value of the energy converter 130, the transistor T40 is saturated and the capacitor C43 discharges, the value at the negative input of the comparator U41 is lower than the voltage on the positive input of the comparator UR1, the output OUT remains at the low state and the energy reserve is not activated.

At the instant 52d, the voltage IN is lower than the minimum operating value of the energy converter 130, the transistor T40 of FIG. 4 is off and the capacitor C43 charges until the instant 50e and the value at the negative input of the comparator U41 is lower than the voltage on the positive input of the comparator UR1, the output OUT remains at the high state and the energy reserve is not activated.

At the instant 50e, the voltage IN is higher than the minimum operating value of the energy converter 130, the transistor T40 of FIG. 4 is saturated and the capacitor C43 discharges, the value at the negative input of the comparator U41 is lower than the voltage on the positive input of the comparator UR1, the output OUT remains at the high state and the energy reserve is not activated.

At the instant 52e, the voltage IN is lower than the minimum operating value of the energy converter 130, the transistor T40 of FIG. 4 is off and the capacitor C43 charges until the instant 54b and the value at the negative input of the comparator E41 is higher than the voltage on the positive input of the comparator UR1, the output OUT passes to the low state and the energy reserve is activated.

Figure 6:
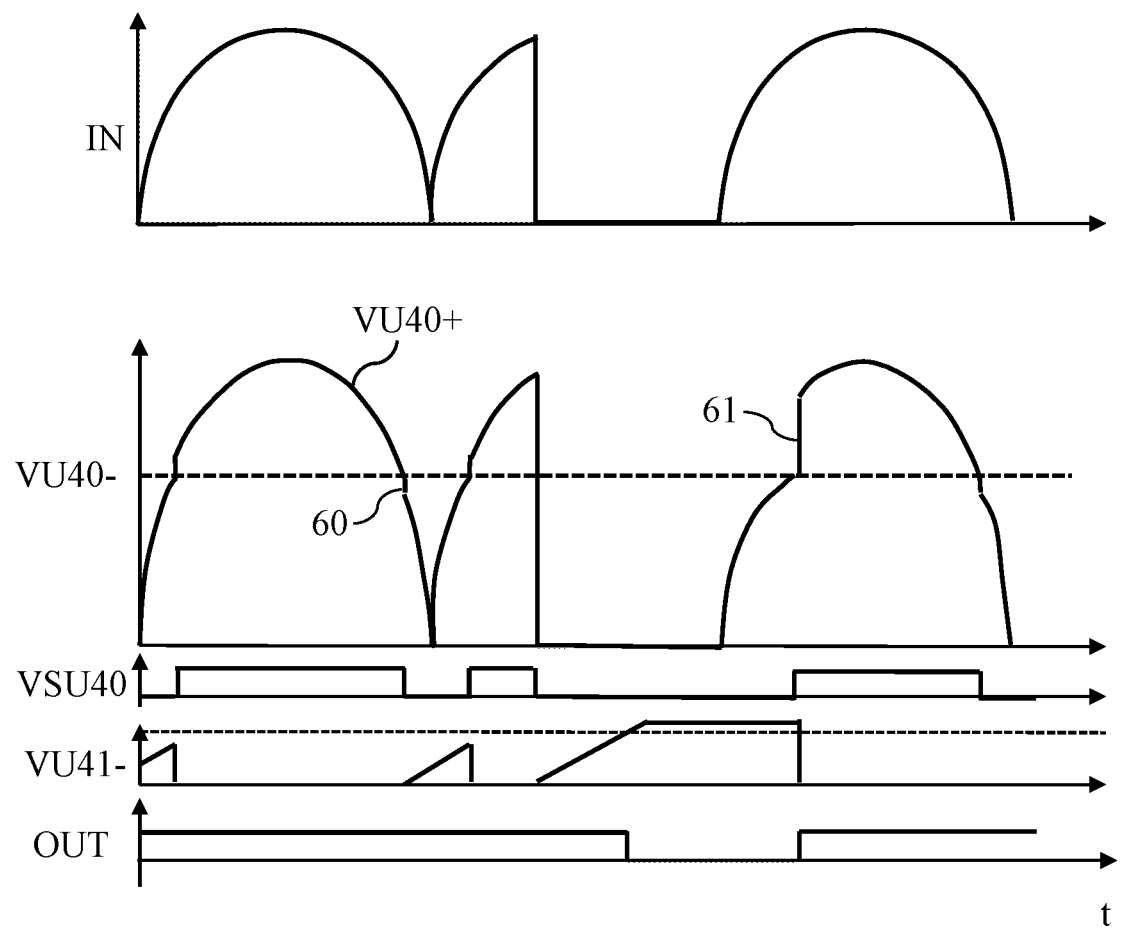
FIG. 6 shows the change in various signals in the module for detecting a drop in voltage of the electrical energy supply when a total loss of AC supply appears and when the electrical energy supply returns to a nominal operating range.

FIG. 6 shows the change in various signals in the module for detecting a drop in voltage of the electrical energy supply when a total loss of AC supply occurs and when the electrical energy supply returns to a nominal operating range.

FIG. 6 shows the voltage IN at the input of the device for detecting a drop in voltage of the electrical energy supply, the voltage OUT at the output of the device for detecting a drop in voltage of the electrical energy supply, the voltage VU40− on the negative input of the comparator U40, the voltage VU40+ on the positive negative input of the comparator U40, the voltage SU40 at the output of the comparator U40 and the voltage VU41− present on the negative input of the comparator U41.

The hysteresis 60 is caused by the conduction of the diode D43.

The hysteresis 61 is caused by the conduction of the diodes D45 and D46.

Figure 7:
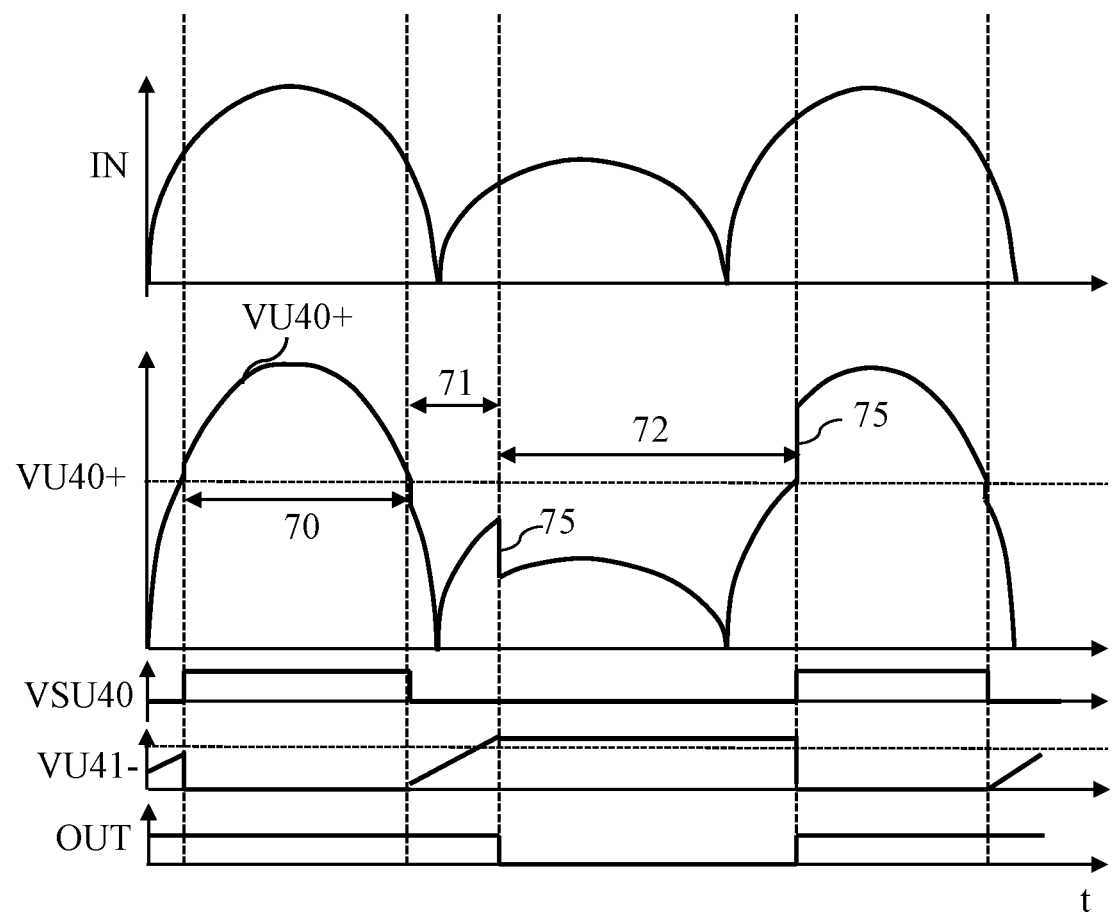
FIG. 7 shows the change in various signals in the module for detecting a drop in voltage of the electrical energy supply when a gradual reduction in the AC supply arises and when the electrical energy supply returns to a nominal operating range.

FIG. 7 shows the change in various signals in the module for detecting a drop in voltage of the electrical energy supply when a gradual reduction in the AC supply occurs and when the electrical energy supply returns to a nominal operating range.

FIG. 7 shows the voltage IN at the input of the device for detecting a drop in voltage of the electrical energy supply, the voltage OUT at the output of the device for detecting a drop in voltage of the electrical energy supply, the voltage VU40− on the negative input of the comparator U40, the voltage VU40+ on the positive negative input of the comparator U40, the voltage SU40 at the output of the comparator U40 and the voltage VU41− present on the negative input of the comparator U41.

During the period denoted 70, the voltage on the positive input at the input of the comparator U40 is higher than the voltage on the negative input of the comparator U40, the output of the comparator U40 is at the high level and saturates the transistor T40 and a hysteresis voltage appears on the positive input of the comparator U40.

During the period denoted 71, the voltage on the positive input at the input of the comparator U40 is lower than the voltage on the negative input of the comparator U40, the output of the comparator U40 is at the low level, and switches the transistor T40 off.

During the period denoted 72, the voltage at the terminals of the capacitor C43 is higher than the voltage on the positive input of the comparator U41, the output of the comparator U41 is at the low state, the diode D45 is conducting and a hysteresis appears on the positive input of the comparator U41; the diode D46 is also conducting and a hysteresis 80 appears on the whole of the detection chain.

The invention claimed is:

1. A device for detecting a drop in voltage of an AC supply delivering electrical energy to an energy converter in order to supply electrical equipment, the device being connected to an electrical energy reserve for supplying the energy converter, wherein the device comprises:
   a full-wave rectifier for rectifying the AC supply,
   a first comparator that compares a first predetermined voltage with a full-wave rectified voltage obtained from a full-wave rectifier that rectifies the AC supply,
   a charging circuit for charging a capacitor in order to charge the capacitor when the rectified voltage is below the first predetermined threshold,
   a discharging circuit for discharging the capacitor in order to discharge the capacitor when the rectified voltage is above the first predetermined threshold,
   a second comparator for comparing voltage at terminals of the capacitor with a second predetermined voltage,
   circuitry causing the device to offset the voltage of the full-wave rectified voltage when the voltage at the terminals of the capacitor is higher than the second predetermined voltage,
   a controlling circuit for controlling the electrical energy reserve in order to activate the electrical energy reserve for supplying electrical energy to the energy converter only when the voltage at the terminals of the capacitor is above the second predetermined voltage.

2. The device according to claim 1, wherein the device comprises circuitry causing the device to offset the voltage of the second predetermined voltage when the first predetermined voltage is higher than the full-wave rectified voltage.

3. The device according to claim 1, wherein the device comprises circuitry causing the device to notify the electrical equipment when the electrical energy reserve is controlled so as to be activated for the supply of electrical energy to the energy converter solely when the voltage at the terminals of the capacitor is higher than the second predetermined voltage.

4. An aircraft, comprising the device for detecting a drop in voltage of the AC supply delivering electrical energy to the energy converter according to claim 1.

* * * * *